United States Patent
Vogl

(10) Patent No.: US 6,928,627 B1
(45) Date of Patent: Aug. 9, 2005

(54) METHOD FOR RECOGNIZING AND AVOIDING ETCH-CRITICAL REGIONS

(75) Inventor: Thomas Vogl, Geretsried (DE)

(73) Assignee: Siemens Aktiengesellschaft, Munich (DE)

( * ) Notice: Subject to any disclaimer, the term of this patent is extended or adjusted under 35 U.S.C. 154(b) by 666 days.

(21) Appl. No.: 09/675,343

(22) Filed: Sep. 28, 2000

(30) Foreign Application Priority Data

Sep. 29, 1999 (DE) .................................. 199 46 753

(51) Int. Cl.⁷ ............................................ G06F 17/50
(52) U.S. Cl. .................. 716/4; 716/19; 716/21
(58) Field of Search ........ 716/1–21; 700/121; 430/4–5, 430/30

(56) References Cited

U.S. PATENT DOCUMENTS

| 5,553,274 A * | 9/1996 | Liebmann ..................... 716/21 |
| 5,671,152 A * | 9/1997 | Lavin et al. ................... 716/19 |
| 5,885,748 A | 3/1999 | Ohnuma |
| 5,923,563 A * | 7/1999 | Lavin et al. ................... 716/19 |
| 6,044,007 A * | 3/2000 | Capodieci ..................... 365/120 |
| 6,077,310 A * | 6/2000 | Yamamoto et al. ........... 716/19 |
| 6,370,441 B1 * | 4/2002 | Ohnuma ..................... 700/121 |
| 6,609,245 B2 * | 8/2003 | Liebmann et al. ............ 716/21 |
| 2003/0046653 A1 * | 3/2003 | Liu .............................. 716/19 |

FOREIGN PATENT DOCUMENTS

DE 196 31 160 2/1997

OTHER PUBLICATIONS

*Handbuch der Leiterplattentechnik*, vol. 2, Neu Verfahren, Neu Technologien, 1991, pp. 22–37.

* cited by examiner

Primary Examiner—Leigh M. Garbowski
(74) Attorney, Agent, or Firm—Morrison & Foerster, LLP

(57) ABSTRACT

In a method for recognizing etch-critical regions, the critical regions are already determined in the layout under the processor control dependent on the fabrication-oriented rules and are automatically rectified in the existing layout, so that under-etchings are avoided in the following etching procedures.

7 Claims, 2 Drawing Sheets

METHOD FOR RECOGNIZING AND AVOIDING ETCH-CRITICAL REGIONS

BACKGROUND OF THE INVENTION

The present invention is directed to a method for avoiding etch-critical problem regions, particularly in the manufacture of silk screening plates, solder stop masks or interconnects on an interconnect base plate.

Before interconnects can be fashioned on an interconnect base plate with etching techniques or silk screening plates can be produced, plastic coatings as well as photosensitive coatings or copper coatings are stripped from a coated base plate in many etching procedures. Respective films that, for example, reproduce an interconnect course in a plane of a multi-layer printed circuit board or writing on a base plate form the basis for the etch-oriented procedures. The film is either physically present or in the form of an electronic description. The electronic description, for example an interconnect course in a plane of a layout, is present in the form of either elementary configuration elements or graphic elements. These configuration elements are respectively based on a describable basic geometric form and are digitally stored.

When etching off a full panoply of coatings from a coated base plate, large particles from the coatings to be stripped can be released due to under-etching in critical regions. Differing from the fabrication intent in the critical regions, the coating to be etched off is not removed over its entire height by etching procedures. Rather, the material of the coating is merely under-etched.

This is accompanied by the disadvantage that the etched-off material particles float within the etchant bath and deposit at different locations on the base plate. These deposits can, for example, lead to serious errors in the interconnect production.

The critical regions tend to form given tight interconnect guidance or interconnect elements that lie in extremely close proximity next to one another. Another critical region can, for example, be caused in that long geometric base forms lie at an acute angle relative to one another. Particular in this latter example, under-etching tends to occur.

In order to avoid under-etching in the critical regions, the surface images of the film were visually examined for such weak points. The weak points that were recognized were then eliminated by manual re-working of the critical regions.

SUMMARY OF THE INVENTION

The present invention is based on the object of providing a method wherein critical regions are recognized and eliminated.

This object is achieved by a method for recognizing and rectifying etch-critical regions comprising the steps of accessing the data structure of a layout, accessing the data structure of the configuration elements arranged in a plane of the layout, using the measures of a program procedure to control a determination of the critical regions between the configuration elements, a modification of the critical regions between the configuration elements and to visually display the modified critical regions between the configuration elements.

The invention yields the advantage that all critical regions are recognized and a formation of particles is avoided by modifying the etch areas in these regions.

The invention also yields the advantage that the critical regions can be arbitrarily defined.

The invention yields the advantage that the manufacturing process can be uniformly designed.

The invention yields the advantage that a change in the regions can be implemented quickly under processor controls in an electronic way or mode.

Other advantages and features of the invention will be readily apparent from the following description of the preferred embodiments, the drawings and claims.

DESCRIPTION OF THE PREFERRED EMBODIMENTS

Figure 1:
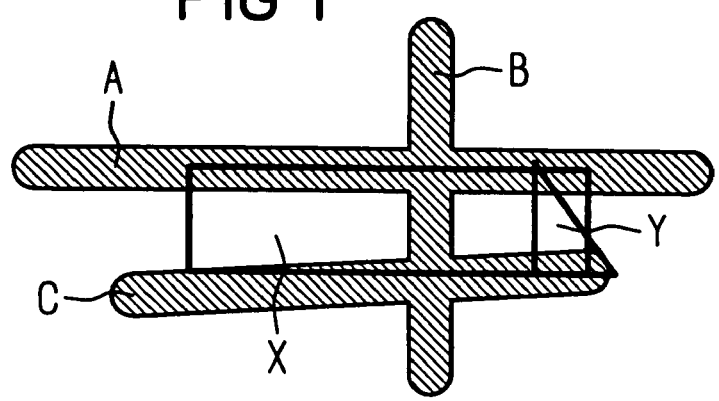
FIG. 1 is a diagrammatic view illustrating the locating of a critical region.
Figure 2:
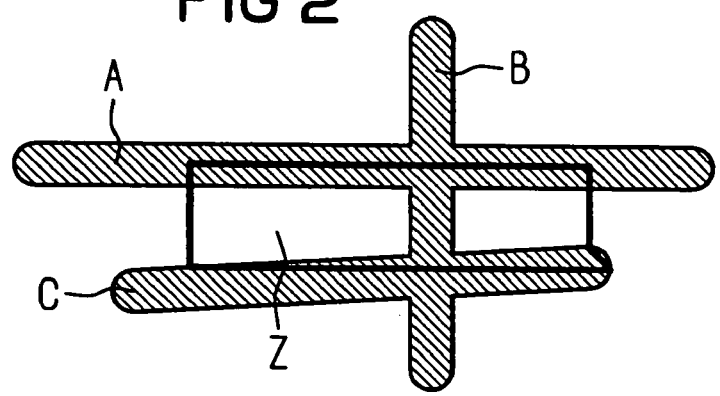
FIG. 2 is a diagrammatic view showing a possible demarcation of the critical regions.
Figure 3:
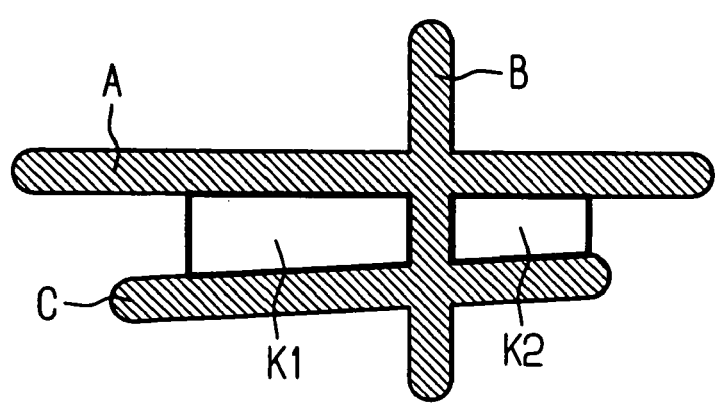
FIG. 3 is a diagrammatic view showing possible modifications of the critical regions.

FIGS. 1, 2 and 3 show a possible polygon formation in the critical regions of a layout. In order to find these critical regions, the layout is scanned in, for example, a first processing step for regions wherein the graphic elements of the layout lie in extremely close proximity to one another or the edge regions of the graphic elements are arranged at an acute angle relative to one another. A part of the layout composed of elementary configuration elements is shown in FIG. 1, and these configuration elements have the shape of polygons.

In FIG. 1, two strip-shaped elements A and C are intersected by a third strip-shaped element B. The spacing between the strip-shaped elements A and C diminishes. The strip-shaped elements A, B and C can be interconnects or parts of a written text. In addition to the spacing of the graphic elements A, B and C from one another, the thickness of the material to be etched away is also to be taken into consideration in the determination of the critical regions. As indicated in FIG. 1, the critical regions are identified and marked with a computer program as polygons X, Y, . . . .

After the determination of the critical regions X, Y, . . . , possible inter-related, critical regions are combined into an area Z in the following processor-controlled processing step, as shown in FIG. 2.

In a further processing step, the combined area Z, as shown in FIG. 3, is limited by the remaining graphic element B. The marked areas K1 and K2 of the critical regions are slightly enlarged in a further processing step.

The individual processing steps from the recognition up to the modification of the layout can be summarized as follows:

Recognition of the critical regions in the layout.

Calculation of the critical regions. The critical regions are determined dependent on fabrication-oriented rules, such as, for example, the thickness of the material or strength of the acid employed in the etching bath.

Demarcation of the identified regions with the possible elements from the same layout plane, so that only uncovered regions of the identified, critical regions remain.

The remaining critical regions are displayed on a picture screen together with the layout in the appertaining layout plane.

The identified and corrected critical regions are slightly enlarged and integrated into the data structure of the respective layout plane.

Figure 4:
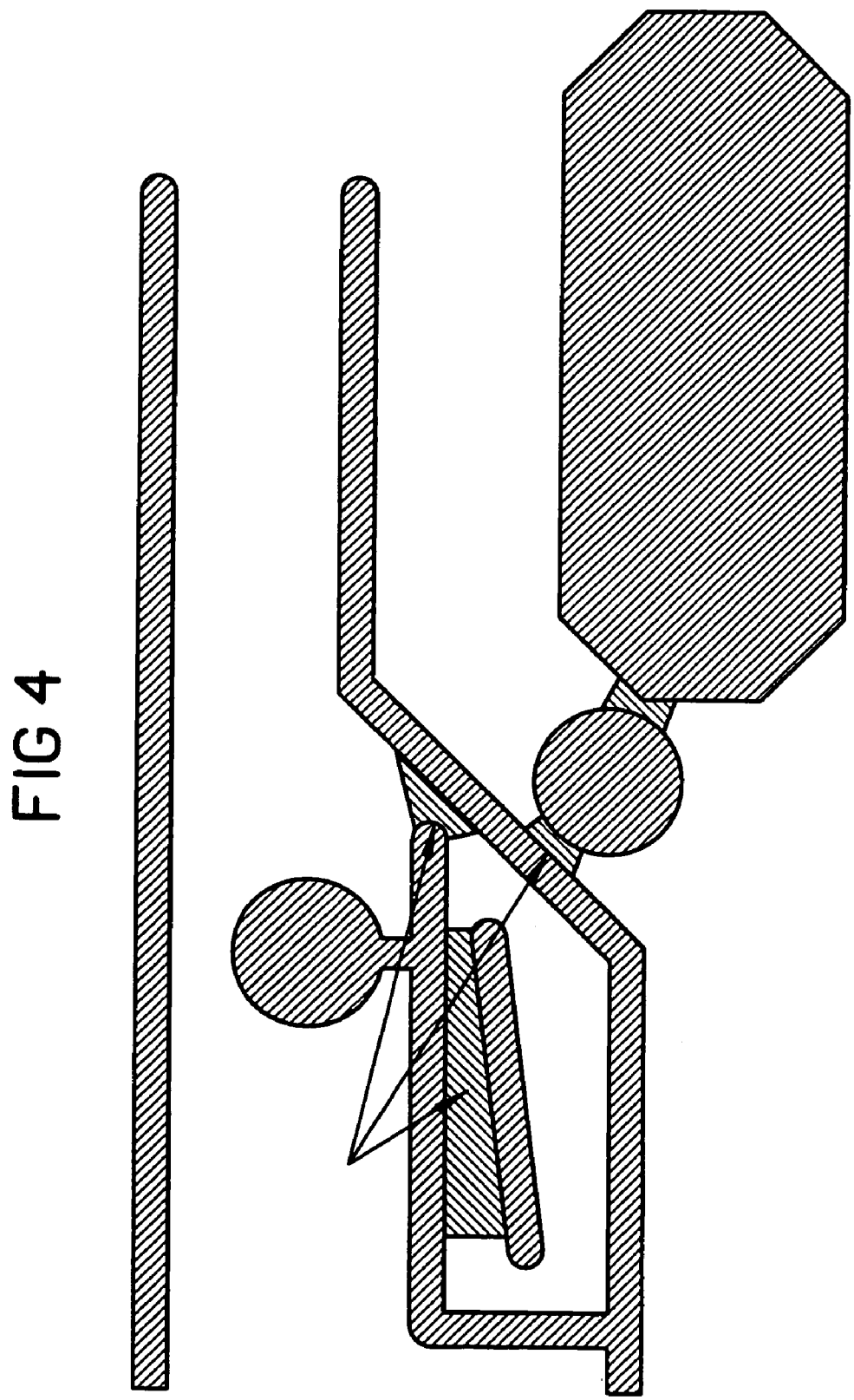
FIG. 4 is a diagrammatic view of an additional printed circuit board division.

In FIG. 4, another excerpt from a further plane of a layout is illustrated. The critical regions here are respectively marked by arrows. In order to avoid any under-etching in the critical regions, the corresponding material remains on the base plate in these regions.

Although various minor modifications may be suggested by those versed in the art, it should be understood that I wish to embody within the scope of the patent granted hereon all such modifications as reasonably and properly come within the scope of my contribution to the art.

I claim:

1. A method for recognizing and rectifying etch-critical regions, said method comprising:
   determining the data structure of a layout;
   determining the data structure of the configuration elements arranged in a plane of the layout;
   determining the critical regions between the configuration elements;
   modifying the critical regions; and
   visually displaying the modified critical regions;
   wherein the determining of the critical regions is at least partially based upon a height and a spacing of a coating to be etched off.

2. The method according to claim 1, wherein the modifying of the critical regions is undertaken so that no under-etching occurs, and said modified critical regions are integrated into the existing data structure of the layout.

3. The method according to claim 1, wherein the critical regions are adjustable by an admissible, fabrication-oriented, minimal spacing between the configuration elements.

4. The method according to claim 3, wherein the critical regions between the configuration elements are filled out by polygons so that the critical regions between the configuration elements are avoided.

5. The method according to claim 4, wherein the polygons of the critical regions are limited given possible superimpositions of the configuration elements.

6. The method according to claim 5, wherein the polygons of the critical regions are enlarged slightly so that the edges of the polygons superimpose with the edges of the configuration elements.

7. The method according to claim 1, further comprising scanning the data structure of the layout using an optical scanner.

* * * * *